(12) United States Patent  (10) Patent No.: US 8,745,851 B2
Wang et al.  (45) Date of Patent: Jun. 10, 2014

(54) PROCESS FOR FABRICATING AN ULTRA-LOW-RESISTANCE SUPERCONDUCTING JOINT HAVING HIGH SHIELDING CHARACTERISTICS

(75) Inventors: Qiuliang Wang, Beijing (CN); Xinning Hu, Beijing (CN); Shousen Song, Beijing (CN); Lijian Ding, Beijing (CN); Luguang Yan, Beijing (CN)

(73) Assignee: Institute of Electrical Engineering, Chinese Academy of Sciences, Beijing (CN)

( * ) Notice: Subject to any disclaimer, the term of this patent is extended or adjusted under 35 U.S.C. 154(b) by 69 days.

(21) Appl. No.: 13/516,039

(22) PCT Filed: Jun. 30, 2010

(86) PCT No.: PCT/CN2010/000986
§ 371 (c)(1),
(2), (4) Date: Jun. 14, 2012

(87) PCT Pub. No.: WO2011/109926
PCT Pub. Date: Sep. 15, 2011

(65) Prior Publication Data
US 2013/0008018 A1 Jan. 10, 2013

(30) Foreign Application Priority Data
Mar. 12, 2010 (CN) .......................... 2010 1 0123276

(51) Int. Cl.
*H01B 12/10* (2006.01)
(52) U.S. Cl.
USPC .................. 29/599; 29/872; 29/868; 505/925

(58) Field of Classification Search
CPC . H01L 39/02; Y10S 505/926; Y10S 505/925; Y10S 505/927; Y10S 428/93; H01R 4/68
USPC ............... 29/599, 868–872; 174/94 R, 125.1; 501/1; 505/806, 815, 930, 925–929
See application file for complete search history.

(56) References Cited

U.S. PATENT DOCUMENTS

| 4,631,808 | A | * | 12/1986 | Jones ............................. 29/599 |
| 4,894,906 | A | * | 1/1990 | Huang ............................ 29/599 |
| 5,292,051 | A | * | 3/1994 | Nagahiro .................. 228/179.1 |
| 5,891,585 | A | * | 4/1999 | Ayai et al. .................... 428/614 |
| 6,387,852 | B1 | * | 5/2002 | Celik et al. ................... 505/434 |

(Continued)

FOREIGN PATENT DOCUMENTS

| CN | 1873847 A | 12/2006 |
| CN | 101517660 A | 8/2009 |
| EP | 2071590 A1 | 6/2009 |
| JP | 2009-231201 A | 10/2009 |

*Primary Examiner* — Minh Trinh
(74) *Attorney, Agent, or Firm* — The Web Law Firm

(57) ABSTRACT

A process for fabricating an ultra-low-resistance superconducting joint that has high shielding characteristics. The process includes: corroding copper on the outer surface at the end of a NbTi/Cu superconducting wire to form terminal NbTi superconducting filaments; inserting same number of NbTi superconducting filaments into each through hole of the niobium layer of a Nb/NbTi/Cu multilayer composite rod; pressing at the outside of the Nb/NbTi/Cu multilayer composite rod to combine the Nb/NbTi/Cu multilayer composite rod and NbTi superconducting filaments together to form a joint; and inserting the joint into a YBCO tube, and then filling the YBCO tube with molten bismuth-lead-tin-cadmium (BiPb-SnCd) alloy solder to form a superconducting joint with high shielding and low resistance characteristics.

4 Claims, 2 Drawing Sheets

(56) References Cited

U.S. PATENT DOCUMENTS

| | | | |
|---|---|---|---|
| 6,498,302 B2 * | 12/2002 | Kaneko | 174/125.1 |
| 7,752,734 B2 * | 7/2010 | Motowidlo | 29/599 |
| 2012/0021915 A1 * | 1/2012 | Kodama et al. | 505/162 |
| 2013/0008018 A1 * | 1/2013 | Wang et al. | 29/599 |

* cited by examiner

PROCESS FOR FABRICATING AN ULTRA-LOW-RESISTANCE SUPERCONDUCTING JOINT HAVING HIGH SHIELDING CHARACTERISTICS

BACKGROUND OF THE INVENTION

1. Technical Field

Present invention relates to a process for fabricating a superconducting joint, particularly to a process for fabricating a superconducting joint for high magnetic field superconducting magnets.

2. Background Art

Low-resistance superconducting joints are key techniques to develop high stability, high magnetic field superconducting magnet systems. Such magnet systems are mainly used in scientific instruments, medical diagnosis, special electric equipments and so on. Generally, due to special application requirements of high magnetic field scientific instruments, the resistance of joints for superconducting wires should be less than $10^{-13}$ ohm to $10^{-14}$ ohm. The low resistance of joints for superconducting wires is important to achieving a highly stable magnetic field in superconducting scientific instruments. Therefore, it is desirable to develop a process for fabricating special joints to achieve stable magnetic field characteristics, and to carry out testing of material structures and realize special functions. At present, the superconducting magnets prepared with superconducting materials such as niobium-titanium (NbTi) and niobium-tin ($Nb_3Sn$) and the like can generate relatively high magnetic fields. Generally, if the magnetic field provided by superconducting magnets is 10 T or less, NbTi superconducting wires can be used to develop superconducting magnets to meet this requirement. If the magnetic field of superconducting magnets is 10 T or more, a combination of NbTi and $Nb_3Sn$ needs to be used. To achieve magnets operated in persistent mode, it is necessary to connect superconducting magnets using joints with ultra low resistance via superconducting switches, to form a magnetic field with a very low rate of field decay.

At present, the processes for fabricating joints of high magnetic field superconducting magnets mainly include cold welding, ultrasonic welding, laser welding and resistance brazing, etc. Since the resistance of a superconducting joint depends on different processes and conditions, and meanwhile magnets are large in size, the processes for fabricating the joints should be as simple and reliable as possible. When the background magnetic field is relatively high, the critical transmission current decreases greatly. In order to obtain superconducting joints having high transmission current and low contact resistance under high magnetic field, it is desirable to develop a process for fabricating more advanced magnet joints.

SUMMARY OF THE INVENTION

In order to overcome the drawbacks of joints made by existing processes, including poor shielding property and relatively high resistance, present invention provides a process for fabricating the connection joints for niobium-titanium/copper (NbTi/Cu) multifilamentary superconducting wires. The present invention can achieve a magnetic field stability of less than $10^{-8}$/h. The current transmission characteristics of superconducting joints under high magnetic field will be greatly improved to realize low resistance working.

The present invention provides a process for fabricating a low resistance superconducting joint with high shielding characteristics; and the process comprises the steps of:

corroding copper (2) on the outer surface at the end of a NbTi/Cu superconducting wire (1) to form terminal NbTi superconducting filaments (3);

inserting the NbTi superconducting filaments (3) into each through hole (8) of a niobium layer (5) of a niobium/niobium-titanium/copper (Nb/NbTi/Cu) multilayer composite rod (4) pressing at the outside of the Nb/NbTi/Cu multilayer composite rod (4) to combine the Nb/NbTi/Cu multilayer composite rod (4) and the NbTi superconducting filaments (3) together to form a joint; and inserting the joint into a yttrium barium copper oxide (YBCO) tube (9), and then filling the YBCO tube (9) with molten bismuth-lead-tin-cadmium (BiPbSnCd) alloy solder, then cooling and solidifying the solder to obtain a low-resistance superconducting joint with high shielding characteristics.

According to the present invention, a mixed strong acid solution of nitric acid and sulfuric acid may be used to corrode the copper on the outer surface at the end of the NbTi/Cu superconducting wire, to form a number of terminal NbTi superconducting filaments, with a length of corroded part (i.e., the length of the terminal NbTi superconducting filaments) of 3 to 6 cm.

According to the present invention, the niobium/niobium-titanium/copper (Nb/NbTi/Cu) multilayer composite rod can be divided into three layers, which are, in a sequence from inner to outer, a niobium (Nb) layer, a niobium-titanium (NbTi) layer and a high purity oxygen-free copper (Cu) layer. A number of through holes are made in the niobium layer.

In the process of present invention, the NbTi/Cu superconducting wires which have been corroded and have a number of terminal NbTi superconducting filaments, and the niobium/niobium-titanium/copper (Nb/NbTi/Cu) multilayer composite rod may be washed with hydrofluoric acid, so as to remove oxide layers on the surface of the superconducting filaments and oxide layers in the through holes of the niobium layer, and then washed with deionized water under ultrasonic wave condition to remove impurities.

In the process of present invention, providing two superconducting wires with the end corroded and washed, inserting the NbTi superconducting filaments into each through hole of the niobium layer of the Nb/NbTi/Cu multilayer composite rod, the number of NbTi superconducting filaments inserted in each through hole is the same. A pressure may be applied in the direction perpendicular to the axis at the outside of the end of the Nb/NbTi/Cu layer composite rod to bind the Nb/NbTi/Cu multilayer composite rod and the NbTi superconducting filaments together to form a joint.

In the process of present invention, the bonded joint may be placed in a yttrium-barium-copper-oxygen (YBCO) tube to ensure that the superconducting joint has high shielding characteristics. The tube may be filled with a molten Wood's alloy solder, which may be bismuth-lead-tin-cadmium (BiPbSnCd) alloy solder, to make the YBCO superconducting tube and the superconducting joint combine together well so as to form a superconducting joint.

In the process of present invention, the Wood's alloy solder may be placed into a YBCO superconducting tube. Thereby, the superconducting joint has both high stability and high current transmission characteristics under a high magnetic field.

The present invention also provides a superconducting joint for the connection between the NbTi/Cu composite superconducting wires. The superconducting joint is particularly suitable for nuclear magnetic resonance superconducting magnets, Fourier ion cyclotron resonance superconducting magnets, and a high magnetic field superconducting magnet system in which the magnetic field should be stable for a long period.

DETAILED DESCRIPTION OF THE EMBODIMENTS

The present invention will be further described with reference to the drawings and examples as follows.

Figure 1:
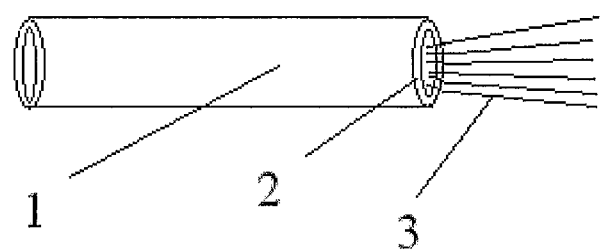
FIG. 1 shows the structural drawing of a corroded NbTi/Cu superconducting wire, in which: 1 denotes the NbTi/Cu superconducting wire, 2 denotes copper, and 3 denotes NbTi superconducting filaments.

As shown in FIG. 1, the copper 2 on the outer surface at the end of the NbTi/Cu superconducting wire 1 was corroded with a mixed solution of nitric acid and sulfuric acid. The length of the corroded part of the NbTi/Cu superconducting wire 1 was 3 to 6 cm. After the corrosion was completed, the copper 2 was corroded, and a number of NbTi superconducting filaments 3 were left. The superconducting filaments 3 were then washed in deionized water.

Figure 2:
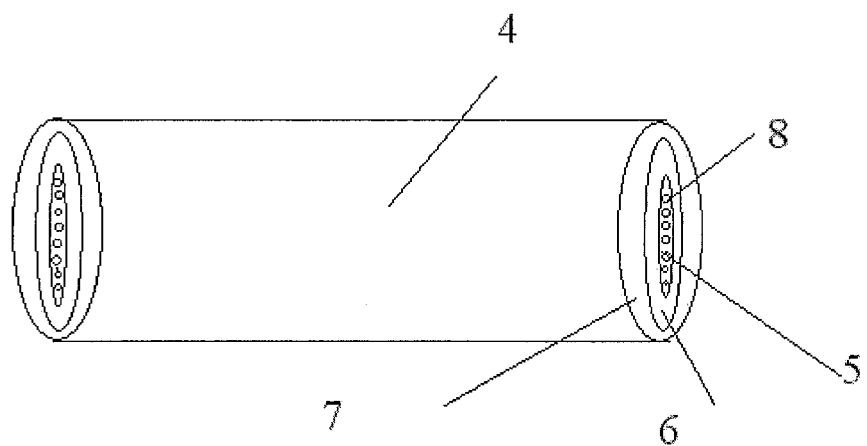
FIG. 2 shows the structural drawing of a composite Nb/NbTi/Cu sleeve, in which: 4 denotes a Nb/NbTi/Cu multilayer composite rod, 5 denotes a niobium layer, 6 denotes a niobium-titanium layer, 7 denotes a high pure oxygen-free copper layer, and 8 denotes through holes.

FIG. 2 shows a Nb/NbTi/Cu multilayer composite rod 4. The Nb/NbTi/Cu multilayer composite rod 4 comprises, from inner to outer, a niobium layer 5, a niobium-titanium layer 6 and a high purity oxygen-free copper layer 7; wherein the niobium-titanium layer 6 may be used for magnetic field shielding, and the high purity oxygen-free copper layer 7 is a substrate for achieving stability of the superconducting structure. A number of through holes 8 were made in the niobium layer 5 of the Nb/NbTi/Cu multilayer composite rod 4.

Figure 3:
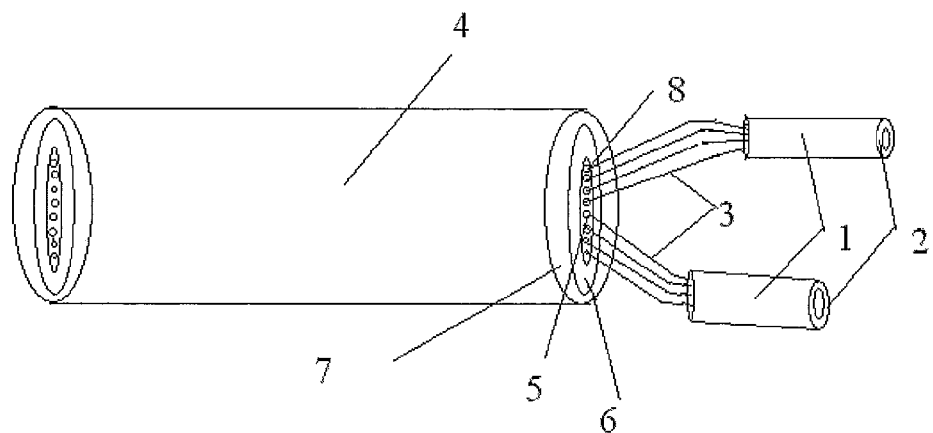
FIG. 3 shows the schematic diagram of the insertion and connection of superconducting filaments and the Nb/NbTi/Cu multilayer composite rod.

As shown in FIG. 3, the NbTi superconducting filaments 3 and Nb/NbTi/Cu multilayer composite rod 4 treated as above were washed in hydrofluoric acid to remove oxide layers. The NbTi superconducting filaments 3 and Nb/NbTi/Cu multilayer composite rod 4 were washed in deionized water under ultrasonic wave condition. The NbTi superconducting filaments 3 were inserted into each through hole 8 of the niobium layer 5 of the Nb/NbTi/Cu multilayer composite rod 4, the number of the NbTi superconducting filaments 3 inserted in each through hole 8 was identical. A pressure was applied at the outside of the Nb/NbTi/Cu multilayer composite rod 4, i.e. a pressure was applied in the direction perpendicular to the axis at the outside of the end of the Nb/NbTi/Cu multilayer composite rod 4 to bind the Nb/NbTi/Cu multilayer composite rod and NbTi superconducting filaments 3 together.

Figure 4:
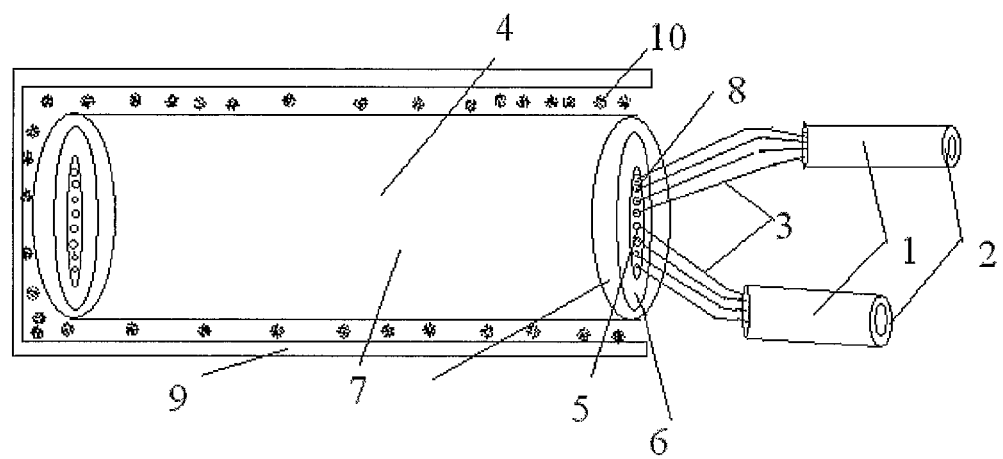
FIG. 4 shows the schematic diagram of sealing the superconducting joint, in which: 9 denotes a YBCO tube, and 10 denotes Wood's alloy solder.

FIG. 4 shows a schematic diagram of sealing the superconducting joints. The bonded joints were inserted in a YBCO tube 9. The YBCO tube was then filled with molten Wood's alloy solder 10, and the solder was cooled and solidified to form a superconducting joint having high shielding and low resistance characteristics.

The invention claimed is:

1. A process for fabricating a low resistance superconducting joint with high shielding characteristics, comprising the steps of:
    corroding copper on an outer surface at an end of a niobium-titanium/copper (NbTi/Cu) superconducting wire to form terminal niobium-titanium (NbTi) superconducting filaments;
    inserting a niobium-titanium (NbTi) superconducting filament into each through hole of a niobium layer of a niobium/niobium-titanium/copper (Nb/NbTi/Cu) multilayer composite rod;
    pressing at an outside of the niobium/niobium-titanium/copper (Nb/NbTi/Cu) multilayer composite rod to combine the niobium/niobium-titanium/copper (Nb/NbTi/Cu) multilayer composite rod and the niobium-titanium (NbTi) superconducting filaments together to form a joint; and
    inserting the joint into a yttrium barium copper oxide (YBCO) tube, and then filling the YBCO tube with molten bismuth-lead-tin-cadmium (BiPbSnCd) alloy solder.

2. The process for fabricating a low resistance superconducting joint with high shielding characteristics according to claim 1, wherein the copper on the outer surface at the end of the niobium-titanium/copper (NbTi/Cu) superconducting wire is corroded with a mixed strong acid solution of nitric acid and sulfuric acid to form one or more terminal NbTi superconducting filaments.

3. The process for fabricating a low resistance superconducting joint with high shielding characteristics according to claim 1, wherein the niobium/niobium-titanium/copper (Nb/NbTi/Cu) multilayer composite rod includes three layers, which are, in a sequence from inner to outer: a niobium layer, a niobium-titanium layer and a high purity oxygen-free copper layer.

4. The process for fabricating a low resistance superconducting joint with high shielding characteristics according to claim 1, wherein the length of the corroded part at the end of the niobium-titanium/copper (NbTi/Cu) superconducting wire is 3 to 6 cm.

* * * * *